United States Patent
Girit et al.

(10) Patent No.: US 12,431,906 B2
(45) Date of Patent: Sep. 30, 2025

(54) VOLTAGE SOURCE AND METHOD FOR CALIBRATING THIS VOLTAGE SOURCE

(71) Applicants: PARIS SCIENCES ET LETTRES, Paris (FR); CENTRE NATIONAL DE LA RECHERCHE SCIENTIFIQUE, Paris (FR); COLLEGE DE FRANCE, Paris (FR)

(72) Inventors: Caglar Girit, Gentilly (FR); Jean-Loup Smirr, Paris (FR)

(73) Assignees: PARIS SCIENCES ET LETTRES, Paris (FR); CENTRE NATIONAL DE LA RECHERCHE SCIENTIFIQUE, Paris (FR); COLLEGE DE FRANCE, Paris (FR)

( * ) Notice: Subject to any disclaimer, the term of this patent is extended or adjusted under 35 U.S.C. 154(b) by 103 days.

(21) Appl. No.: 18/026,758

(22) PCT Filed: Sep. 17, 2021

(86) PCT No.: PCT/EP2021/075681
§ 371 (c)(1),
(2) Date: Mar. 16, 2023

(87) PCT Pub. No.: WO2022/058534
PCT Pub. Date: Mar. 24, 2022

(65) Prior Publication Data
US 2023/0341880 A1    Oct. 26, 2023

(30) Foreign Application Priority Data

Sep. 17, 2020    (FR) ........................... 2009405

(51) Int. Cl.
*H03K 19/195* (2006.01)
*G01R 33/035* (2006.01)

(52) U.S. Cl.
CPC ....... *H03K 19/195* (2013.01); *G01R 33/0358* (2013.01)

(58) Field of Classification Search
None
See application file for complete search history.

(56) References Cited

U.S. PATENT DOCUMENTS 5,479,131 A    12/1995    Lee
5,565,866 A    10/1996    Hamilton et al.
(Continued)

FOREIGN PATENT DOCUMENTS

CN    203313163    11/2013
CN    104597315    5/2015
(Continued)

OTHER PUBLICATIONS

Nissila et al., Driving a Josephson junction array with a mode-locked laser and a photodiode, 2018, IEEE (Year: 2018).*

(Continued)

*Primary Examiner* — Thomas J. Hiltunen
(74) *Attorney, Agent, or Firm* — NIXON & VANDERHYE

(57) ABSTRACT

Embodiments of the present disclosure provide a pixel circuitry, a drive method thereof, an array substrate and a display panel. The pixel circuitry includes circuits designated: drive $C_D$, data write $C_{DW}$, initialization $C_I$, first light emission control $C_{LEC1}$, first storage $C_{S1}$, second storage $C_{S2}$ and second light emission control $C_{LEC2}$. $C_D$ connects to first through third nodes $N_1$-$N_3$ and provides drive current to a light emitting device. $C_{DW}$ connects to $N_1$ and provides a data signal to $C_D$ according to a drive signal. $C_I$ provides an initialization signal to $N_2$ according to a reset signal. $C_{LEC1}$ provides a first voltage signal to $N_3$ according to a first light emission control signal. $C_{S1}$ and $C_{S2}$ store a voltage differ- (Continued)

ence between the first voltage signal terminal and $N_2$, and $N_1$ and $N_2$, respectively. $C_{LEC2}$ controls the drive current to the light emitting device according to a second light emission control signal.

18 Claims, 10 Drawing Sheets

(56) References Cited

U.S. PATENT DOCUMENTS

| | | | |
|---|---|---|---|
| 5,764,048 | A | 6/1998 | Yoshida |
| 5,812,078 | A | 9/1998 | Przybysz et al. |
| 6,236,344 | B1 | 5/2001 | Benz et al. |
| 2007/0132481 | A1 | 6/2007 | Chong et al. |
| 2023/0231631 | A1* | 7/2023 | Kemppinen ........... G02B 6/122 398/140 |
| 2023/0239054 | A1* | 7/2023 | Nissilä ................ H04B 10/508 398/182 |

FOREIGN PATENT DOCUMENTS

| | | |
|---|---|---|
| CN | 105628992 | 6/2016 |
| CN | 211457087 | 9/2020 |
| DE | 197 14 191 | 7/1998 |
| DE | 102 18 695 | 12/2003 |
| DE | 10 2004 028 907 | 2/2006 |
| EP | 1 420 263 | 5/2004 |
| JP | S55-162065 | 12/1980 |
| JP | 2005-300317 | 10/2005 |
| JP | 2006-344761 | 12/2006 |
| JP | 2010-199343 | 9/2010 |
| KR | 10-2010-0056622 | 5/2010 |
| WO | 2020/183060 | 9/2020 |

OTHER PUBLICATIONS

International Search Report dated Dec. 22, 2021, for PCT/EP2021/075681, 5 pages.
Written Opinion of the ISA dated Dec. 22, 2021, for PCT/EP2021/075681, 7 pages.
Shapiro S., "Josephson Currents in Superconducting Tunneling: the Effect of Microwaves and Other Observations", United State: N.p., Web. doi:10.1103/PhysRevLett.11.80., Jul. 15, 1963, 6 pages.
T.J. Quinn, "Base United of the Système International d'Unités, their Accuracy, Dissemination and International Traceability", Metrologia, 26(1), 69-74 (1989), 13 pages.
Charles J. Burroughs et al., "NIST 10 V Programmable Josephson Voltage Standard System", Instrumentation and Measurement, IEEE Transactions on instrumentation and measurement, vol. 60, No. 7, Jul. 2011, 2482-2488. 10.1109/TIM.2010.2101191, 7 Pages.
G. J. Dolan, "Offset masks for lift-off photoprocessing", Applied Physics Letters, 31(5), Sep. 1, 1977, 337-339, 3 pages.
B.D. Josephson, "Possible New Effects in Superconductive Tunnelling", Physics Letters, vol. 1, Issue 7, ISSN 0031-9163, Jun. 8, 1962, pp. 251-253, 3 pages.
Joël Griesmar, "A mesoscopic spectrometer based on the Josephson effect", Physics [physics]., Université Paris sciences et lettres, Dec. 10, 2018, 296 pages.

* cited by examiner

VOLTAGE SOURCE AND METHOD FOR CALIBRATING THIS VOLTAGE SOURCE

This application is the U.S. national phase of International Application No. PCT/EP2021/075681 filed Sep. 17, 2021 which designated the U.S. and claims priority to FR 2009405 filed Sep. 17, 2020, the entire contents of each of which are hereby incorporated by reference.

TECHNICAL FIELD

The present invention relates to the technical field of voltage sources, more precisely voltage sources of high accuracy, in particular metrological accuracy.

In particular, the invention relates to a voltage source and a method for calibrating the voltage source.

TECHNOLOGICAL BACKGROUND

In the above field, there exist voltage sources including an integrated circuit placed in a superconducting state and including one or more so-called "Josephson" junctions. These voltage sources, whose operation is based on the AC Josephson effect, make it possible to provide an electrical voltage with a very high accuracy, typically an accuracy of at least 100 picovolts for 1 volt. These sources are used in particular to provide a standard value of the volt. The use of the AC Josephson effect to produce electrical voltages is described in the article "Sidney Shapiro, *Josephson Currents in Superconducting Tunneling: The Effect of Microwaves and Other Observations, Phys. Rev. Lett.* 11, 80, 1963".

However these sources do not allow continuous adjustment of the voltage they produce, or at least do not allow fine enough or discontinuity-free adjustment. In particular, the adjustment pitch of theses sources is lower than the adjustment pitch of certain conventional, or non-metrological, voltage sources, that is to say for example a resolution lower than 10 microvolts for 1 volt. Moreover, for the sources of the PJVS ("Programmable Josephson Voltage Standard") type, the adjustment of such sources generate signals that may exhibit inaccurate transient states.

Therefore, it is not possible to use these high-accuracy sources as arbitrary function generators in order in particular to provide arbitrary signals to electrical devices in operation.

Although certain sources, in particular those of the JAWS ("Josephson Arbitrary Waveform Synthesizer") type, allow the generation of variable voltages of RMS amplitude with metrological accuracy, they have other defects, in particular a lower accuracy and a residual discretization in the voltage variation, which limits the resolution. Moreover, this technique does not allow producing a strictly DC voltage.

In certain fields, in particular mesoscopic physics or quantum computers, the lack of accuracy of the conventional adjustable voltage sources and the defects of the metrological voltage sources are obstacles to improving the performances of the electronic devices.

DISCLOSURE OF THE INVENTION

The present invention proposes a solution to the above-mentioned problems.

According to one aspect, it is proposed an electrical voltage source comprising an integrated circuit including a first input terminal and a second input terminal configured to receive an electrical control signal, a first output terminal and a second output terminal configured to provide an output voltage, a junction module including at least one Josephson junction and that is coupled to the first and second input terminals and to the first and second output terminals in such a way that the output voltage value depends on the frequency of the electrical control signal, a cryogenic module configured to maintain the integrated circuit in conditions in which the integrated circuit is in a superconducting state, a microwave generator coupled to first and second input terminals and configured to produce the electrical control signal, characterized in that the electrical voltage source contains an adjustment module configured to adjust the amplitude of the electrical control signal as a function of its frequency according to a predetermined rule.

Such a device advantageously makes it possible to provide an adjustable voltage with a metrological accuracy. In particular, the presence of a Josephson junction and the adjustment of the frequency in connection with the amplitude of the control signal allow a stable adjustment of the output voltage for a wide frequency band of the control signal.

According to an embodiment, the predetermined rule includes the association of at least certain frequency values of the control signal with a respective optimum amplitude value.

According to an embodiment, the predetermined rule includes the association of each frequency of a set of frequencies of the control signal with an optimum amplitude of the control signal for which a Shapiro current of the junction module is non-zero and preferably higher than a predetermined threshold. For example, the predetermined threshold is determined as a function of the load coupled to the voltage source and/or as a function of the current fluctuations through the junction module caused by the electromagnetic environment thereof. This predetermined threshold is preferably higher than the current consumed by the load, and typically at least 10 nA in a laboratory cryostat at a temperature of 10 mK.

According to an embodiment, the adjustment module is configured to adjust the frequency of the electrical control signal in a predetermined frequency band.

According to an embodiment, the predetermined frequency band has a width of at least 5 GHz.

According to an embodiment, the predetermined frequency band covers frequencies between 9 and 40 GHz.

According to an embodiment, the adjustment module is configured to adjust the frequency of the electrical control signal with an adjustment pitch lower than or equal to 100 kHz. For example, in an embodiment, the adjustment pitch is lower than or equal to 1 Hz.

According to an embodiment, a variation of 1 Hz of the frequency of the control signal causes a variation of 1 Hz*h/2e=2.06783383 femtovolts of the output voltage, where h is Planck's constant and e the electron charge. With a control signal of maximum frequency 40 GHz, this corresponds to a resolution of $2.5*10^{-11}$.

According to an embodiment, the junction module is coupled to the first and second input terminals via a wide-band coupling circuit.

A wide-band coupling circuit is here to be understood as a circuit configured to transmit a microwave frequency signal with a rate of change of the attenuation lower than 5 dB/10 MHz in the whole predetermined frequency band.

According to an embodiment, the wide-band coupling circuit includes an electric path that couples the junction module to the first and second input terminals and whose length is lower than the wavelength of the control signal in the integrated circuit, at the maximum frequency of said predetermined frequency band.

According to an embodiment, the first input terminal and the second input terminal are coupled to the microwave generator via a microwave transmission line.

A transmission line is here to be understood as a physical means for transmitting a microwave frequency signal, characterized by a characteristic impedance constant over its length, thus avoiding the occurrence of internal reflections creating longitudinal modes, and hence resonances.

A transmission line may include components such as attenuators or amplifiers, provided that they produce no impedance discontinuity.

Preferentially, the transmission line is a coaxial cable, having for example a characteristic impedance of 50 Ohms.

According to an embodiment, the junction module includes a first junction electrode coupled to the first output terminal and coupled to the first input terminal via a first decoupling capacitor, and a second junction electrode coupled to the second output terminal and coupled to the second input terminal via a second decoupling capacitor.

The decoupling capacitors may be made directly on the integrated circuit or by any other method ensuring a good coupling of the AC signal between the transmission line and the junction module, while minimizing the coupling of the DC current.

According to an embodiment, the junction module includes a plurality of Josephson junctions.

According to an embodiment, at least two junctions of the plurality of junctions are mounted in parallel. This makes it possible to increase the maximum current provided by the source.

According to an embodiment, at least two junctions of the plurality of junctions are mounted in series. This makes it possible to increase the voltage provided by the source.

According to an embodiment, the predetermined rule includes the association of at least certain frequency values of the control signal with a respective optimum amplitude value, the adjustment module being configured to make the voltage source pass from a first configuration, in which the control signal has a first frequency value and a corresponding first optimum amplitude value in the lookup table, to a second configuration, in which the control signal has a second frequency and a corresponding second optimum amplitude in the lookup table.

A look-up table is particularly advantageous to link frequency and amplitude values of the control signal in the absence of mathematical relation between these two magnitudes.

According to an embodiment, the adjustment module is configured to interpolate an intermediate amplitude value as a function of at least two amplitude values associated with consecutive frequency values in the lookup table.

This advantageously makes it possible to reduce the size of the lookup table, which then contains only certain frequencies of the predetermined frequency band, in a sufficient density to allow the interpolation. For example, a maximum spacing of 100 MHz between the consecutive frequencies in the lookup table suits to the interpolation of intermediate values. A different maximum spacing, for example 200 MHz, 40 MHz or 20 MHz, may also suit. The person skilled in the art will be able to chose the maximum spacing as a function of the interpolation method used and the characteristics of the electric path between the control signal generator and the junction module.

According to an aspect, it is proposed a method for calibrating a voltage source according to the invention, including, for each frequency a set of frequencies of the control signal, determining an optimum amplitude of the control signal for which a Shapiro current of the junction module 12 is non-zero, for example higher than a predetermined threshold, and preferably maximum, and establishing a predetermined rule for associating each frequency with a corresponding optimum amplitude.

For example, the predetermined threshold is determined as a function of the load coupled to the voltage source and/or as a function of the current fluctuations through the junction module caused by the electromagnetic environment thereof. This predetermined threshold is preferably higher than the current consumed by the load, and typically at least 10 nA in a laboratory cryostat at a temperature of 10 mK.

According to an embodiment, the predetermined rule includes the association of at least certain frequency values of the control signal with a respective optimum amplitude value using a lookup table.

According to an embodiment, the Shapiro current is a Shapiro current of order 1 or a Shapiro current of order 2.

The Shapiro current of order n of a Josephson junction is the DC current that circulates between the electrodes of a Josephson junction when an AC voltage is applied to said electrodes in the presence of a DC component of the voltage between the electrodes of the junction equal to $$Vn = n\frac{h}{2*e}f \qquad \text{[Math. 1]}$$

with h the Planck's constant, e the elementary charge of an electron and f the frequency of the AC voltage, here the control signal.

The Shapiro current of order 0, for which the DC component of the voltage between the electrodes of the junction is zero, is conventionally called "supercurrent".

According to an embodiment, the determination of the optimum amplitude includes
  a. polarizing the junction module in such a way that the output voltage is zero and that a non-zero current passes through the junction module,
  b. measuring the output voltage, the measurement being characterized by a measurement uncertainty,
  c. determining a minimum amplitude value of the control signal at which the output voltage varies with a predetermined amplitude,
  d. applying a predetermined coefficient to the minimum amplitude value in order to obtain said optimum amplitude value.

According to an embodiment, the predetermined amplitude is equal to four times the measurement uncertainty.

According to an embodiment, said frequencies of the set of frequencies are spaced apart by a maximum of 100 MHz.

This advantageously makes it possible to accurately deduce, for example by interpolation, intermediate frequency values that have not been measured and the optimum amplitude values that are associated therewith. Therefore, it is necessary to obtain a lookup table containing all the frequencies of the predetermined frequency band and the calibration method is thus simplified.

Obviously, the different features, alternatives and embodiments of the invention can be associated with each other according to various combinations, insofar as they are not incompatible or exclusive with respect to each other.

BRIEF DESCRIPTION OF THE FIGURES

Moreover, various other features of the invention emerge from the appended description made with reference to the drawings that illustrate non-limiting embodiments of the invention, and wherein.

It is to be noted that, in these figures, the structural and/or functional elements common to the different alternatives may have the same references.

Various other modifications may be made to the invention within the scope of the appended claims.

DETAILED DESCRIPTION

Figure 1:
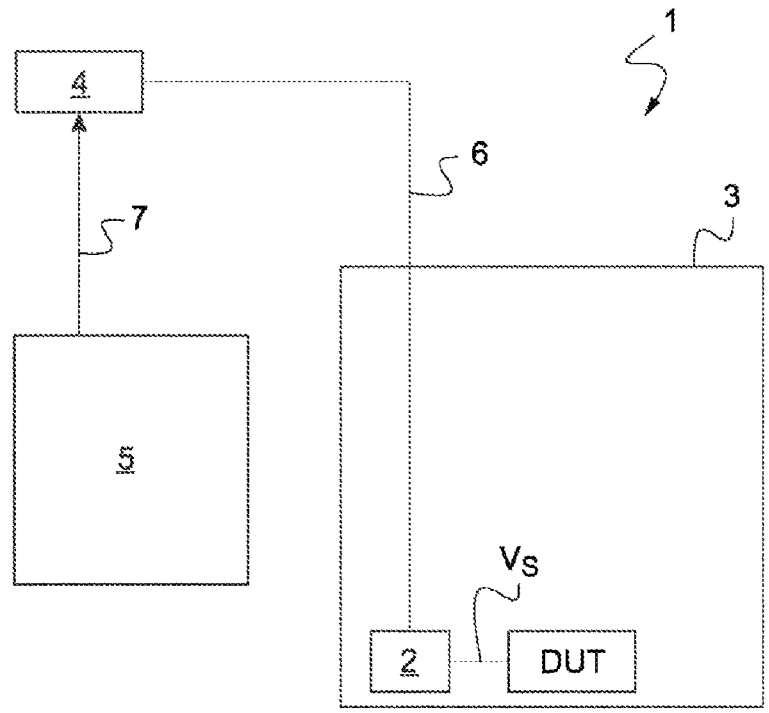
FIG. 1 is a diagram illustrating a voltage source according to the invention.

The voltage source 1 illustrated in FIG. 1 includes an integrated circuit 2 placed inside a cryogenic module 3, a microwave generator 4 and an adjustment module 5. An electrical device DUT is here powered by the voltage source 1.

The integrated circuit 2 is made on a semi-conductor or insulating substrate, for example here non-doped silicon, and includes conductive portions, for example here aluminium, and insulating portions, for example here aluminium oxide. The materials of the integrated circuit 2 are here chosen in such a way that the integrated circuit 2 can be in a superconducting state, provided the suitable temperature conditions imposed in particular by the cryogenic module. This circuit 2 is configured to provide an output voltage Vs and will be described in more details hereinafter.

The cryogenic module 3 is here a dilution cryostat conventionally including a thermally insulating box housing a vacuum chamber with a mixing space supplied by a fluid pumping and circulating circuit. The fluids are here conventionally two helium isotopes, helium-3 and helium-4. The cryogenic module 3 makes it possible to reach, in its lower part containing the integrated circuit 2, temperatures lower than 100 mK, in particular here a temperature of 10 mK.

At this temperature, the integrated circuit 2 is in a superconducting state, that is to say a state in which its conductive elements have no electrical resistance.

The integrated circuit 2 is controlled by the microwave generator 4 that produces a control signal 6, here an AC voltage, liable to take frequency values lower than 300 GHz.

The adjustment module 5 is here configured to adjust the amplitude of the electrical control signal 6 as a function of its frequency according to a predetermined rule. Here, the adjustment module 5 is configured to control the microwave generator 4, in particular by imposing the frequency and the amplitude of the control signal 6.

For example here, the adjustment module 5 is a computer comprising conventionally a processor, a memory storing a program code, and a human-machine interface allowing a user to input certain parameters, in particular the value of the desired output voltage Vs. Here, the program code is configured to implement an algorithm translating the desired output voltage value Vs, input by the user, into a couple of frequency and optimum amplitude values of the control signal 6, linked to each other by the predetermined rule. For example, the adjustment module is configured to send to the microwave generator a setting signal 7 including adjustment instructions relating to the frequency-optimum amplitude couple values of the control signal 6. The possible values of the frequency-optimum amplitude couple of the control signal are here recorded into a lookup table stored in the memory of the adjustment module 5. The lookup table here defines the predetermined rule.

For example here, the lookup table contains a list of frequencies included in a predetermined frequency band, the width of which is at least 5 GHz, and in particular here 40 GHz and extending in this example between 0 and 40 GHz. The frequencies of the lookup table are here spaced apart by a pitch of 100 MHz, each of these frequencies being associated with a corresponding optimum amplitude.

The adjustment module 5 is here configured to interpolate the intermediate frequencies, that is to say the frequencies included in the predetermined frequency band but not present in the lookup table, as well as the intermediate optimum amplitudes corresponding to the intermediate frequencies. Therefore, although the frequencies of the lookup table are separated by a pitch of 100 MHz, the adjustment module 5 can adjust the control signal with other frequency and amplitude values than those present in the lookup table, by means of an interpolation using the amplitude values respectively associated with at least two frequencies of the lookup table, for example here two frequencies. For example, the adjustment module 5 is configured to adjust the frequency of the control signal with a pitch of 10 KHz.

In the configuration of the voltage source 1 illustrated herein, the microwave generator 4 is configured to generate the control signal 6 in the predetermined frequency band.

Figure 2:
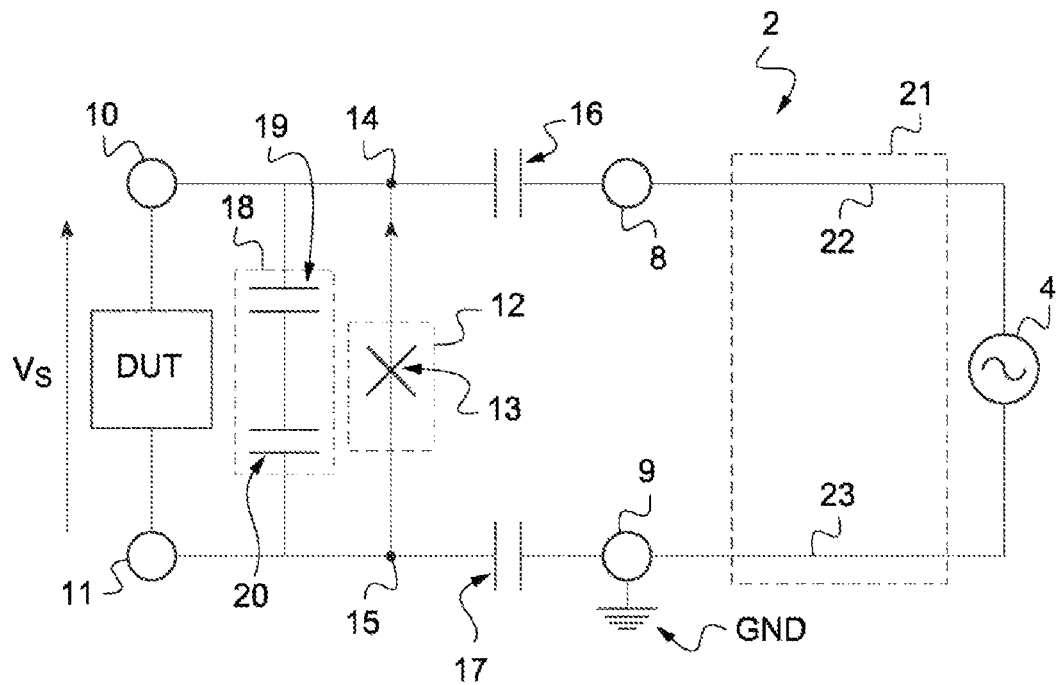
FIG. 2 is an electrical diagram of an integrated circuit of a voltage source according to the invention that supplies an electronic device.

The integrated circuit 2, schematically illustrated in FIG. 2, includes a first input terminal 8 and a second input terminal 9 configured to receive the control signal 6. The integrated circuit 2 further includes a first output terminal 10 and a second output terminal 11 configured to provide the output voltage Vs.

The integrated circuit 2 includes a junction module 12 here including a Josephson junction 13, a first junction electrode 14 of which is conductively coupled, i.e. via a contact connection (non-capacitive), to the first output terminal 10 and to the first input terminal 8 via a first decoupling capacitor 16, and a second junction electrode 15 of which is conductively coupled to the second output terminal 11 and to the second input terminal 9 via a second decoupling capacitor 17. The first decoupling capacitor 16 here has a capacitance of 10 pF and the second decoupling capacitor 17 here has a capacitance of 10 pF.

The electrical path from the input terminals 8 and 9 to the junction electrodes 14 and 15 and including the first capacitor 16 and the second capacitor 17 here forms a wide-band coupling circuit.

A capacitive module 18 is coupled between the first output terminal 10 and the second output terminal 11. Here, the capacitive module 18 includes a third capacitor 19 and a fourth capacitor 20 coupled in series between the first output terminal 10 and the second output terminal 11. The role of the capacitive module 18 is to reduce the AC component of the current circulating through the junction module by providing a low-impedance path for the high-frequency signals, thus reducing the potential chaotic effects of the feedback between the junction module and the control signal. The third capacitor 19 and the fourth capacitor 20 have values at least 100 times higher than the intrinsic capacitance value of the junction module 12, for example here values of at least 10 picofarads.

Therefore, the voltage Vs is the DC component of the voltage between the junction electrodes 14 and 15.

The first and second input terminals 8, 9 are coupled to the microwave generator 4 via a microwave transmission line 21 including a first conductor 22 coupled to the first input terminal 8 and a second conductor 23 coupled to the second input terminal 9 and to the ground GND. For example here, the transmission line 21 is a 50 Ohm impedance coaxial cable.

The first output terminal 10 and the second output terminal 11 are here coupled to the electronic device DUT for the latter to be powered by the voltage source 1.

Thanks to the just-described integrated circuit 2 and to the properties of the Josephson junction 13, the output voltage Vs depends on the frequency of the control signal 6. For example here, the output voltage Vs depends on the frequency of the control signal in such a way that a 1 Hz variation of the frequency of the control signal 6 causes a 2.06783383 femtovolt variation of the output voltage Vs.

Figure 3:
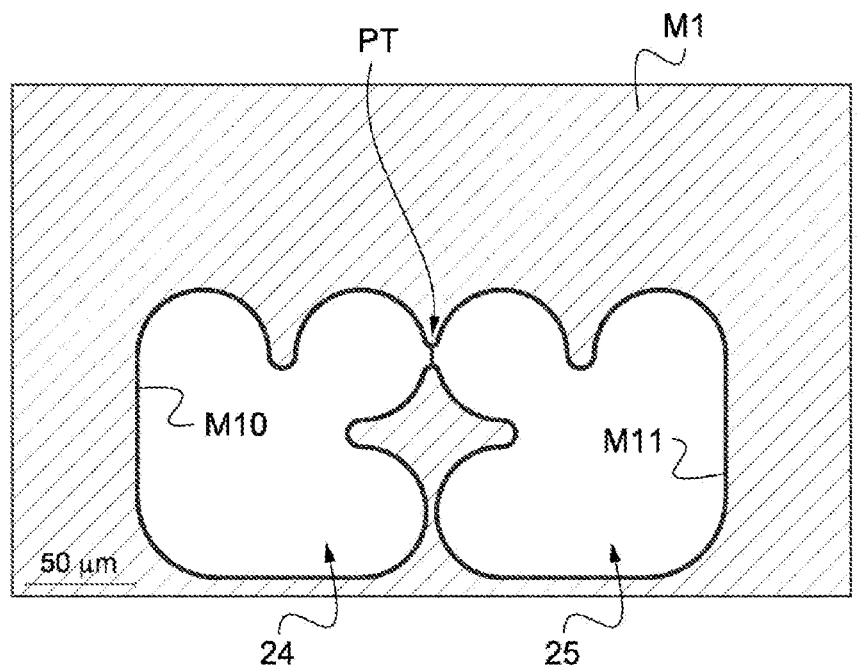
FIG. 3 illustrates a first mask used in a step for manufacturing the integrated circuit of FIG. 2.
Figure 4:
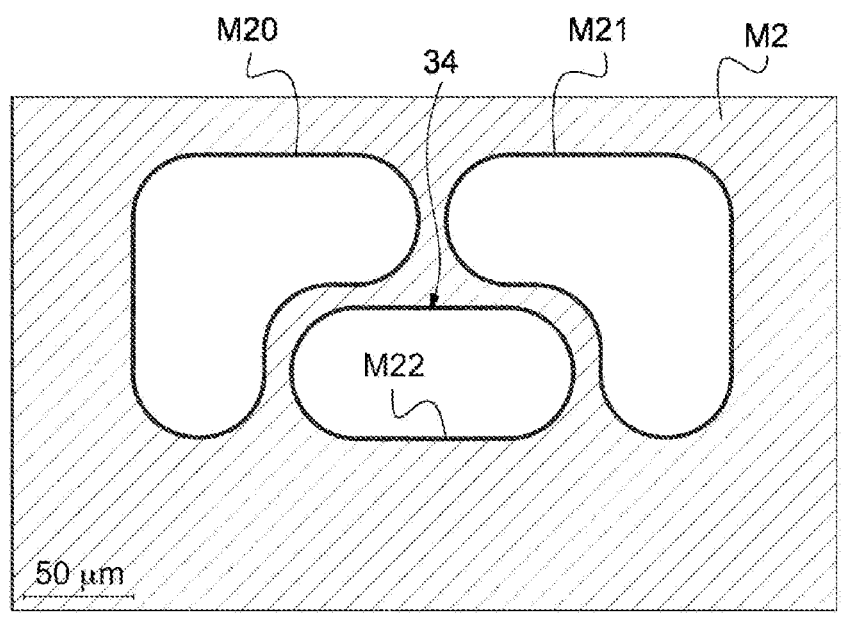
FIG. 4 illustrates a second mask used in a second step for manufacturing the integrated circuit of FIG. 2, FIG. 5 a top topographic view of the integrated circuit of FIG. 2.
Figure 5:
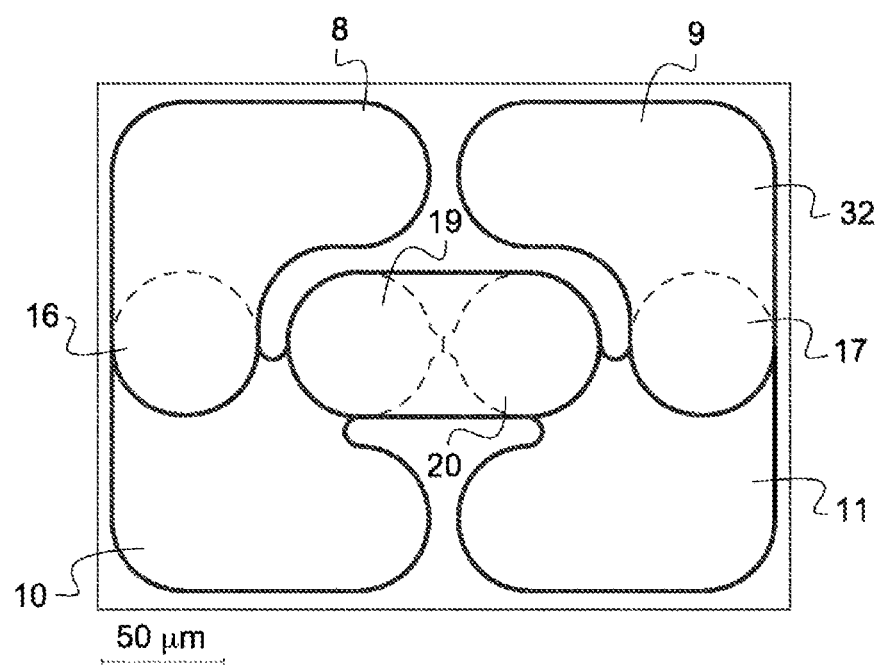

FIGS. 3 to 5 illustrate steps of manufacturing the integrated circuit 2.

During a first manufacturing step, a first stack of the circuit is deposited through a first mask M1 (shown in FIG. 3) consisted of two superposed layers of resin, the lower layer being about 2 µm thick, and the upper layer being about 1.5 µm thick and being photosensitive. The mask M1 includes a first opening M10 and a second opening M11 made by optical lithography followed by a development.

The two-layer structure of the first mask M1 allows the formation of a bridge PT formed by the upper layer of resin, that is to say an area of about 1 µm by 4 µm that separates the two openings M10 and M11, the lower layer of resin being entirely dissolved under the bridge. This bridge, in particular known as "Dolan bridge", allows the making of a Josephson junction, as described hereinafter.

The formation of the first stack of the circuit includes depositing a 30 nanometre thick first sub-layer of aluminium with a non-zero deposition angle, in such a way that part of the deposition is made under the bridge PT. For example here, the deposition angle is an angle of +26°, defined by rotation around the longitudinal axis of the bridge PT, the zero angle corresponding to a direction perpendicular to the substrate. The first manufacturing step further includes oxidizing the first sub-layer of aluminium under 200 millibars of oxygen for 10 minutes, in such a way as to form a layer of aluminium oxide on the first sub-layer of aluminium, and depositing a 50 nanometre thick second sub-layer of aluminium with a second deposition angle opposite to the first deposition angle, here an angle of −26°, in such a way that part of the deposition is made under the bridge PT, above the layer of aluminium oxide, thus forming the Josephson junction 13 under the bridge PT. This step of making a Josephson junction, conventional and known per se, is described in particular in more detail in the article "Dolan, G. J. (September 1977). *Offset masks for lift-off photoprocessing. Applied Physics Letters,* 31(5), 337-339."

The mask M1 is then dissolved in order to remove the material evaporated during the first step on the non-developed areas.

A first portion of the first stack of the circuit, located above a first area of the substrate corresponding to the first opening M10, will form, once the manufacturing method completed, the first output terminal 10, a first electrode of the first capacitor 16, a first electrode of the third capacitor 19, and the first junction electrode 14. A second portion of the first stack of the circuit, located above the second area of the substrate corresponding to the second opening M11, will form the second output terminal 11, a first electrode of the second capacitor 17, a first electrode of the fourth capacitor 20, and the second junction electrode 15.

During a second manufacturing step, two successive depositions are made using a second mask M2 (shown in FIG. 4) including a first opening M20, a second opening M21 and a third opening M22, to form a second stack of the circuit comprising a 100 nanometre thick lower insulating layer, for example here a layer of aluminium oxide, and a 200 nanometre thick upper layer, for example here a layer of aluminium.

The mask M2 is then dissolved in order to remove the material evaporated during the second step on the non-developed areas of the mask.

A first portion of the second stack of the circuit forms the first input terminal 8 and forms, at the place where it partially covers the first portion of the first stack of the circuit above the first area of the substrate, the dielectric and a second electrode of the first capacitor 16.

A second portion of the second stack of the circuit forms the second input terminal 9 and forms, at the place where it partially covers the second portion of the first stack of the circuit above the second area of the substrate, the dielectric and the second electrode of the second capacitor 17.

A third portion of the second stack of the circuit covers part of the first portion and part of the second portion of the first stack above a third area 34 of the substrate corresponding to the third opening M22 and thus forms the second electrode of the third capacitor 19 and the second electrode of the fourth capacitor 20.

A top view of the integrated circuit 2 obtained by the above-described manufacturing method is illustrated in FIG. 5. The integrated circuit 2 here extends over a surface area of 280×205 square micrometres, and could as an alternative extend over the whole surface area, insofar as the circuit allows a wide-band coupling of the control signal between the input terminals 8, 9 and the junction electrodes 14, 15.

Here, the size of the openings of the masks M1 and M2, and hence the size of the integrated circuit 2, are chosen in such a way that an electrical signal circulating between the first input terminal 8 or the second input terminal 9 and the junction module 12 travel along a distance lower than the wavelength of the control signal 6 at the maximum frequency of the predetermined frequency band (here, 40 GHz). For example here, this distance is equal to 140 micrometres.

Figure 6:
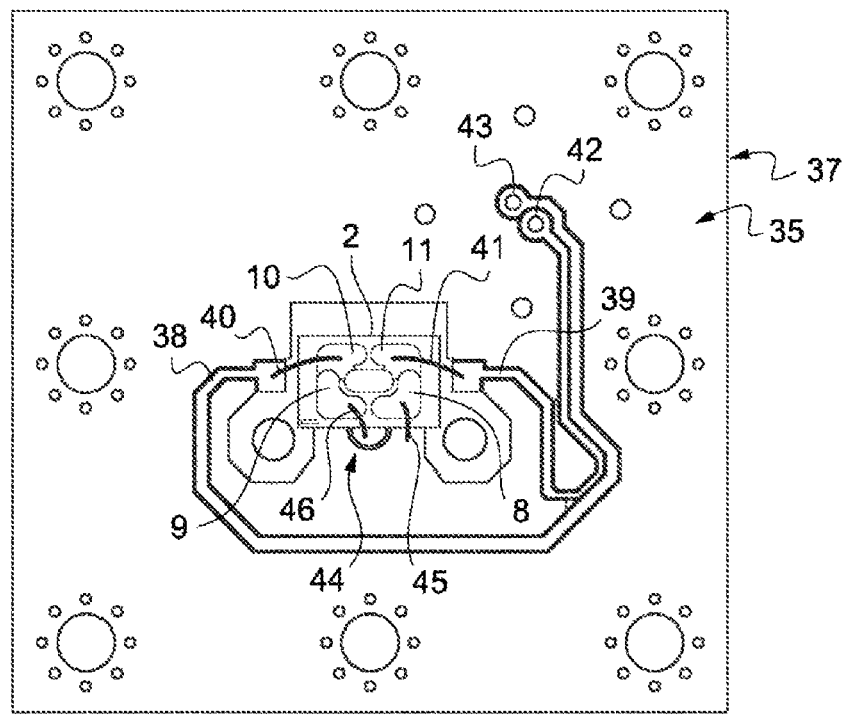
FIG. 6 illustrates a first side of a printed circuit board integrating the integrated circuit of FIG. 2.
Figure 7:
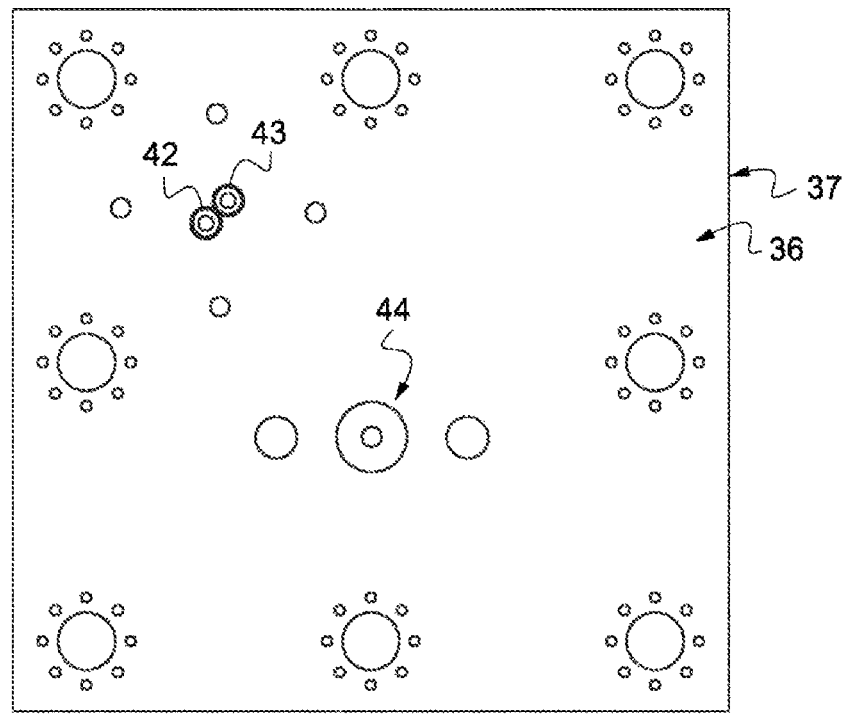
FIG. 7 illustrates a second side of the printed circuit board of FIG. 6.

FIGS. 6 and 7 respectively illustrate a first side 35 and a second side 36 of a printed circuit board 37 to which the integrated circuit 2 is attached and connected. For example, the printed circuit board 37 may be fitted with connectors and placed in an electrical protection and shielding box.

The first output terminal 10 and the second output terminal 11 are here electrically coupled to a first metal track 38 of the board 37 via a first conductor wire 40 and to a second metal track 39 of the board 37 via a second conductor wire 41, respectively. The metal tracks 38, 39 are here made of copper and the conductor wires 40, 41 are here made of aluminium and made by micro-welding. Preferably, the wires 45 and 46 have a length lower than 1 millimetre.

The first and second metal tracks 38, 39 here extend over the first side 35 of the printed circuit board 37, up to a first through-via 42 and a second through-via 43, respectively, configured to allow an electric contact from the second side 36 of the board. The through-vias 42, 43 are for example here configured to allow the connection of a connector on the second side 36 of the board.

The first input terminal 8 and the second input terminal 9 are each coupled to a connector 44 for microwave transmission line, here a coaxial cable connector, by a third conductor wire 45 and a fourth conductor wire 46, for example here aluminium wires made by micro-welding. The connector 44 is here surface-connected by compression at the second side 36, and electrically coupled to the first side 35 through a via adapted to transmit microwave frequency signals.

Figure 8:
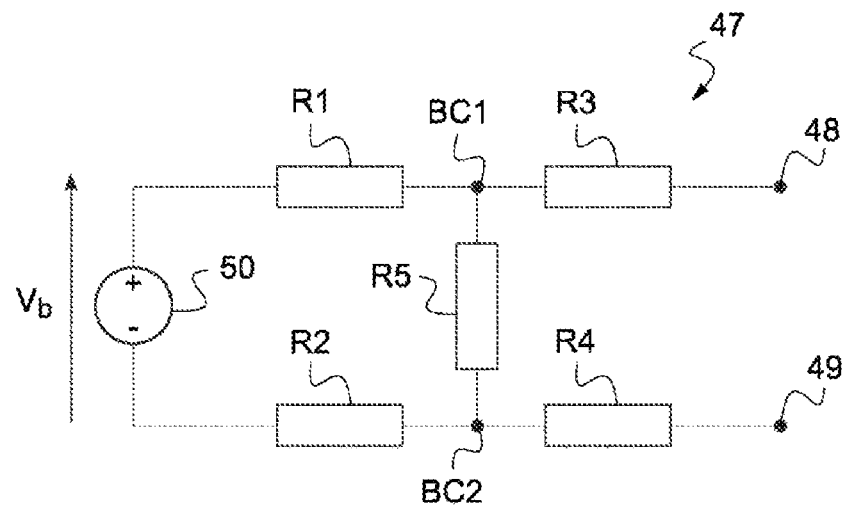
FIG. 8 illustrates a polarizing circuit used in a method for calibrating the voltage source according to the invention.

FIG. 8 illustrates a polarization circuit 47 configured to be coupled to the integrated circuit 2 during a calibration method according to the invention. The polarization circuit 47 is in particular configured to make a current circulate through the junction module 12 and to vary the value of this current.

The polarization circuit 47 includes a first polarization terminal 48 and a second polarization terminal 49 configured to be coupled to the first output terminal 10 and to the second output terminal 11, respectively.

The polarization circuit 47 is here coupled to a voltage generator 50 configured to produce a polarization voltage Vb and includes a first resistance R1 and a second resistance R2 of 10 kilo-ohms each, a third resistance R3 and a fourth resistance R4 of 50 ohms each, and a fifth resistance R5 of 20 ohms.

A first terminal BC1 of the fifth resistance R5 is common to the first resistance R1 and to the third resistance R3 and a second terminal BC2 of the fifth resistance R5 is common to the second resistance R2 and to the fourth resistance R4. A second terminal of the first resistance R1 is coupled to the positive terminal of the voltage generator 50, a second terminal of the second resistance R2 is coupled to the negative terminal of the voltage generator. A second terminal of the third resistance R3 is coupled to the first polarization terminal 48 and a second terminal of the fourth resistance R4 is coupled to the second polarization terminal 49.

Figure 9:
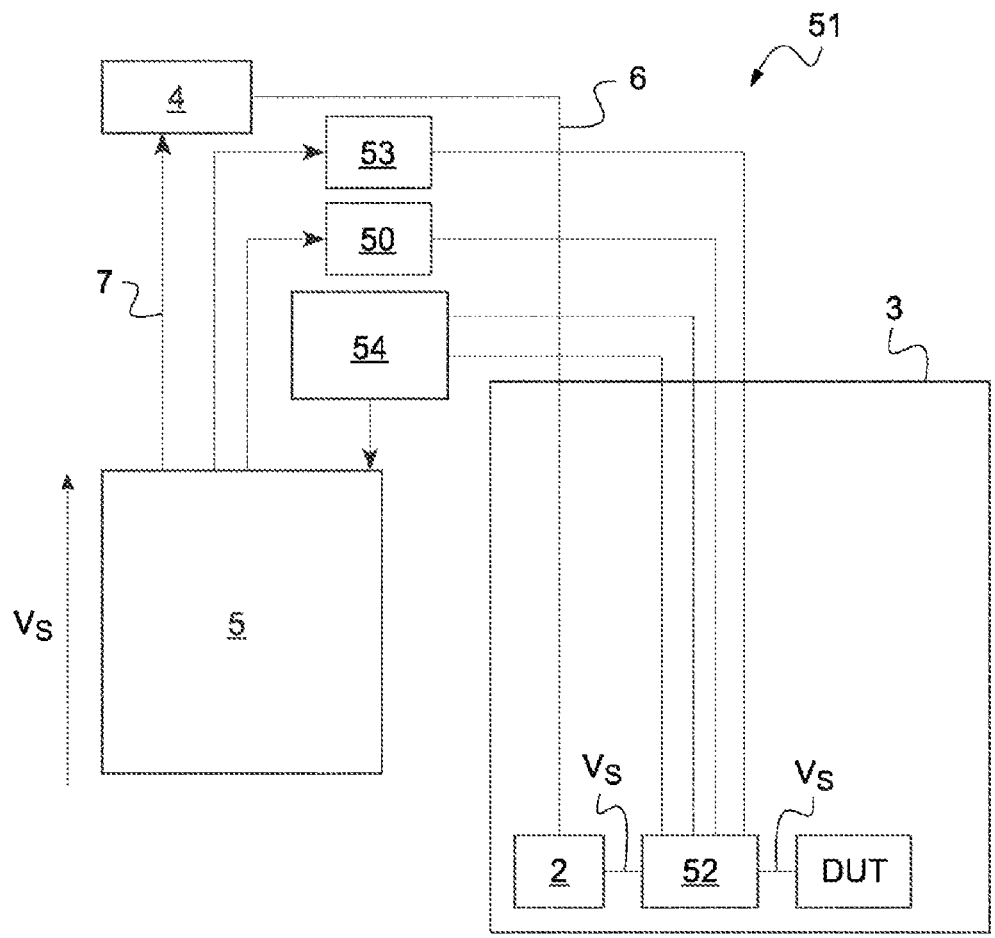
FIG. 9 illustrates a system for calibrating the voltage source according to the invention.

The calibration system 51 illustrated in FIG. 9 includes the voltage source 1 as described hereinabove in relation with FIG. 1, a calibration box 52 including the polarization circuit 47, the voltage generator 50, a measurement module 54, here an oscilloscope, configured to measure the output voltage Vs and the current through the junction module 12, which is equal to the voltage across the resistance R3 divided by the value of the resistance R3, and to transmit the measured values to the adjustment module 5, as well as a switching module 53 configured to switch the system from a first configuration in which the system 51 can be calibrated to a second configuration in which the system 51 is, from a functional point of view, identical to the current source 1 illustrated in FIG. 1.

The switching module 53 includes for example an electrical system for controlling an electromechanical relay making it possible to open or close simultaneously the electrical path between the terminal 48 of the polarization module and the terminal 10 of the junction module, and the electrical path between the terminal 49 of the polarization module and the terminal 11 of the junction module. Therefore, the switching module 53 controls the coupling of the polarization circuit 47 to the integrated circuit 2.

The voltage generator 50 and the switching module 53 are controlled by the adjustment module 5.

The method for calibrating the voltage source 1 is here implemented by the calibration system 51. It includes, for each frequency of the control signal 6 in the predetermined frequency band, determining the optimum amplitude of the control signal 6 for which the Shapiro current of order 1 of the junction module 12 is maximum, or, as an alternative, higher than a predetermined threshold, for example a threshold chosen as a function of the current fluctuations through the junction module caused by the electromagnetic environment thereof. This predetermined threshold is preferably higher than the current consumed by the load, and typically at least 10 nA in a laboratory cryostat at a temperature of 10 mK.

The method further includes a recording into a lookup table stored in the memory of the computer 50 each so-determined frequency-optimum amplitude couple.

Figure 10:
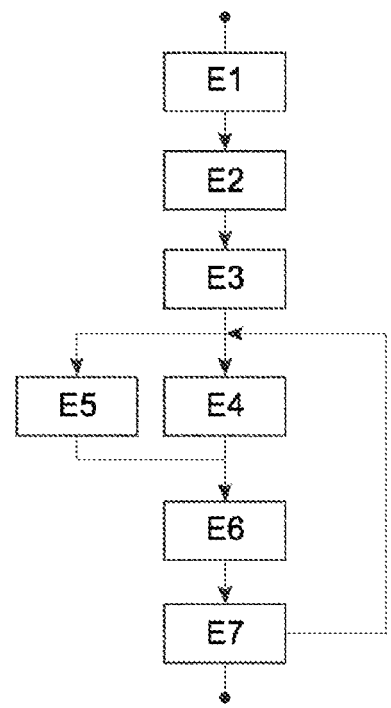
FIG. 10 illustrates a method for calibrating the voltage source according to the invention.

FIG. 10 illustrates the steps E1 to E7 of an exemplary embodiment of the method according to the invention.

During a first step E1, the amplitude of the control signal 6 is set to zero. Here, the amplitude is set by the adjustment module 5 via the setting signal 7, which deactivates the microwave source 4.

During a second step E2, the adjustment module 5 sets the voltage generator 50 so that the polarization voltage Vb is such that the junction module has a zero voltage between its electrodes 14, 15 and is passed through by a low current, or calibration current Ib. The polarization voltage Vb is chosen so that the value of the current Ib is lower than the critical current Ic of the junction, for example lower than one tenth of the critical current Ic of the junction. In this example, the calibration current is equal to one thirtieth of the value of the critical current Ic, that is to say equal to a value of 10 nA. The output voltage Vs is thus zero. The value of the polarization voltage Vb is for example determined according to the values of the resistances R1, R2, R3, R4 and R5 of the polarization circuit 47, the characteristics of the junction module 12, in particular the number of junctions, the material and the size of each junction and according to the performances of the measurement system 54.

The critical current Ic of a Josephson junction, or here of the junction module 12, is conventionally defined as being the maximum value of supercurrent able to pass through the junction or the junction module, that is to say here the maximum value of current able to circulate between the zero-voltage junction electrodes 14 and 15. For example here, the value of the critical current of the junction module 12 is equal to 300 nanoamperes.

During a third step E3, the adjustment module 5 sets the frequency of the control signal 6 in such a manner that the control signal has a current frequency whose value is chosen in the predetermined frequency band.

During a fourth step E4, the adjustment module 5 varies the amplitude of the control signal 6, between an initial adjustment value Ai, for example here −60 dBm and a final amplitude value Af, for example here 0 dBm.

The amplitude can be varied continuously, or discretely, for example by choosing the amplitude values in a pre-established list. The variation between the initial amplitude value Ai and the final value Af can be linear or logarithmic.

The application of the control signal 6 to the junction module 12 has for effect to modify the toggle threshold 10 of the supercurrent, that is to say the supercurrent threshold for which the junction module toggles.

The toggling of a Josephson junction initially passed through by a Shapiro current of order n corresponds to a state change of the junction during which, in particular, the DC component of the voltage between the electrodes of the junction, here the output voltage Vs, switches from its current value Vn, here zero, to another value. The toggling is triggered by an increase of the Shapiro current of order n, here the supercurrent (order 0), in such a way as to reach the toggle threshold.

Figure 11:
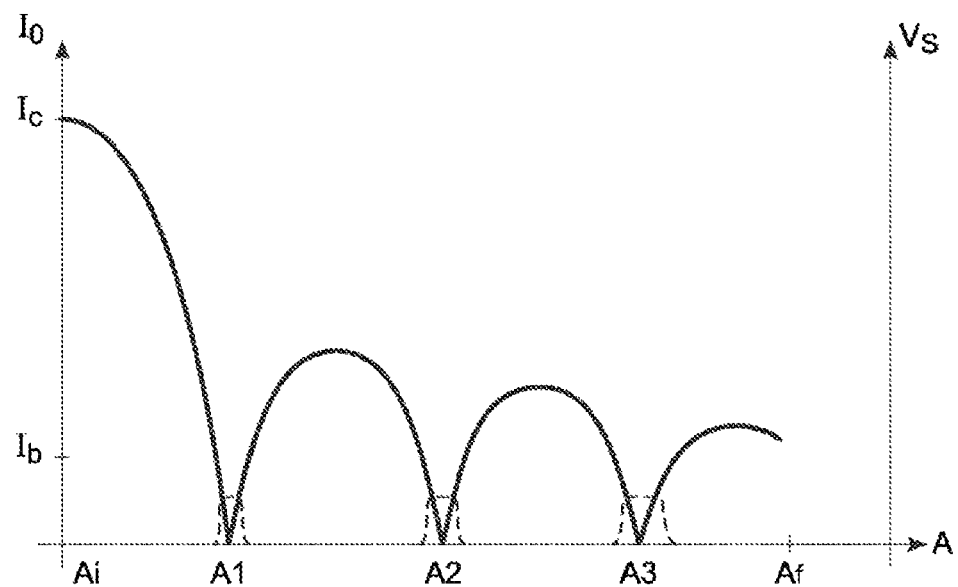
FIG. 11 illustrates the evolution of the output voltage of the voltage source and the toggle threshold of a junction during an implementation of the method according to the invention.

And, varying the amplitude of the control signal varies the toggle threshold 10 of the supercurrent. In FIG. 11, the curve in solid line shows the evolution of the toggle threshold 10 of the supercurrent as a function of the amplitude A of the control signal 6; the curve in dashed line schematically shows the output voltage Vs as a function of the amplitude A.

It is observed on this curve that, in the absence of control signal 6, or in other words, for a zero amplitude value of the control signal 6, the toggle threshold value of the supercurrent is close to or equal to its critical value Ic, the difference between the toggle threshold and the critical value depending in particular on the experimental disturbances. For example, this difference may be of the order of 10%.

Although the amplitude of the control signal 6 varies between the initial amplitude value Ai, here equal to zero, and the final amplitude value Af, the value of the output voltage Vs is measured so as to determine the minimum amplitude value of the control signal 6 for which the toggle threshold 10 of the supercurrent is equal to or lower than the value of the calibration current Ib circulating in the junction, here called first cancelling amplitude.

Indeed, when the value of the toggle threshold 10 becomes lower than or equal to the polarization current value, then the junction module 12 toggles, that is to say acts here as an open circuit, and the voltage between the junction electrodes 14, 15 increases and becomes non-zero.

As illustrated in FIG. 11, non-zero values of the voltage Vs are here measured around three amplitude values A1, A2, A3. More precisely here, around each of these three amplitude values A1, A2, A3, the voltage Vs exhibits a measurable deviation forming a voltage plateau. Therefore, at these points, the junction module acts as an open circuit and the output voltage Vs is non-zero.

It may thus be deduced therefrom that, around these three amplitude values A1, A2, A3, the toggle threshold 10 of the supercurrent is lower than or equal to the calibration current Ib. Here, the minimum amplitude value is the value A1.

Moreover, by taking advantage of the quasi-symmetry of the evolution profile of the toggle threshold 10 around the non-zero voltage plateaux, the values A1, A2, A3 may be estimated as the values located in the middle of each voltage plateaux. The value A1 is a reasonable approximation of the first cancelling amplitude.

During a sixth step E6, a first predetermined coefficient is applied to the first cancelling amplitude A1, in such a way as to obtain the optimum amplitude value for which, at the current frequency, the Shapiro current of order 1 of the junction module is maximum, or as an alternative, higher than the predetermined threshold.

The first predetermined coefficient is heuristically determined at the beginning of a calibration to any frequency value and corresponds to the ratio between the first optimum amplitude and the first cancelling amplitude. The predetermined coefficient is identical for all the frequencies of the predetermined frequency band. The predetermined coefficient is lower than 1.

The heuristic determination of the predetermined coefficient can be made as a function of a measurement of the current-voltage characteristic of the junction module, as a function of the amplitude of the control signal, by iteratively searching for the amplitude of the control signal that minimizes the supercurrent.

A good starting value for finding the predetermined coefficient is for example 0.7656.

The current-voltage characteristic of a junction module is defined as the set of points (I,V) such that V is the DC voltage across the junction module and I the DC current passing through the junction module, equal to the voltage across the resistance R3, divided by the value of the resistance R3 of the polarization circuit 47. The current-voltage characteristic is obtained by measuring the values I,V for several values of the polarization voltage Vb produced by the generator 50 in a suitable set.

A suitable set of polarization voltages Vb for measuring the current-voltage characteristic is for example a set of 1000 values between a minimum value and a maximum value, the minimum value and the maximum value being preferentially opposed, the maximum value causing a voltage value across the junction module equal to at least 2*D/e, with e the electron charge and D the energy of the superconducting gap of the material of the junction module electrodes. Here, the electrodes are made of aluminium and D=200 μeV or so.

The current frequency/optimum amplitude couple is recorded in the lookup table.

During a seventh step E7, if the value of the current frequency is not equal to the maximum value of the frequency of the predetermined frequency band, the value of the current frequency is incremented and the method restart at the third step.

The current frequency value incrementation is here a 100 MHz incrementation, but it can take any suitable value for implementation of an interpolation, for example 50 Hz, 10 kHz or even 1 Hz.

The calibration method ends when steps E3 to E6 have been implemented for all the possible frequency values of the predetermined frequency band, taking into account the chosen incrementation.

Once the calibration method completed, the voltage source 1 as described hereinabove can be used according to the following steps.

The toggling module disconnects the polarization circuit 47 from the voltage source 1.

A desired output voltage value Vss is indicated via the adjustment module 5, for example via the human-machine interface of the adjustment module 5. The adjustment module 5 determines the frequency f corresponding to the desired output voltage Vss, in such a way that Vss=1*hf/2e.

During a so-called locking step, the control signal 6 having the frequency f and the cancelling amplitude A1 is applied to the junction module 12, in order to minimize the toggle threshold of the supercurrent. Therefore, the zero-voltage toggle threshold being zero, the current fluctuations, in particular spurious fluctuations produced by the experimental environment cause a toggling of the junction towards a non-zero voltage state. Due to the absence of polarization circuit 47, hence to the very-high impedance environment of the junction module, the output voltage Vs toggles to the desired output voltage value Vss=hf/2e, and a Shapiro current of order 1 appears.

The amplitude of the control signal 6 is then set to the optimum value, so that the toggle threshold of the Shapiro current of order 1 is maximum, which allows the voltage source 1 to provide a maximum current. The presence of a maximum current minimizes the sensitivity of the source to the spurious fluctuations that could cause the junction module to toggle towards a non-defined different voltage, thus avoiding a malfunction of the voltage source 1.

When a different desired output voltage is indicated, the adjustment module selects a frequency/optimum amplitude couple in the lookup table and applied the control signal having these frequency and amplitude values.

The changeover time from a couple of values to another one is preferably lower than 1 ms.

Figure 12:
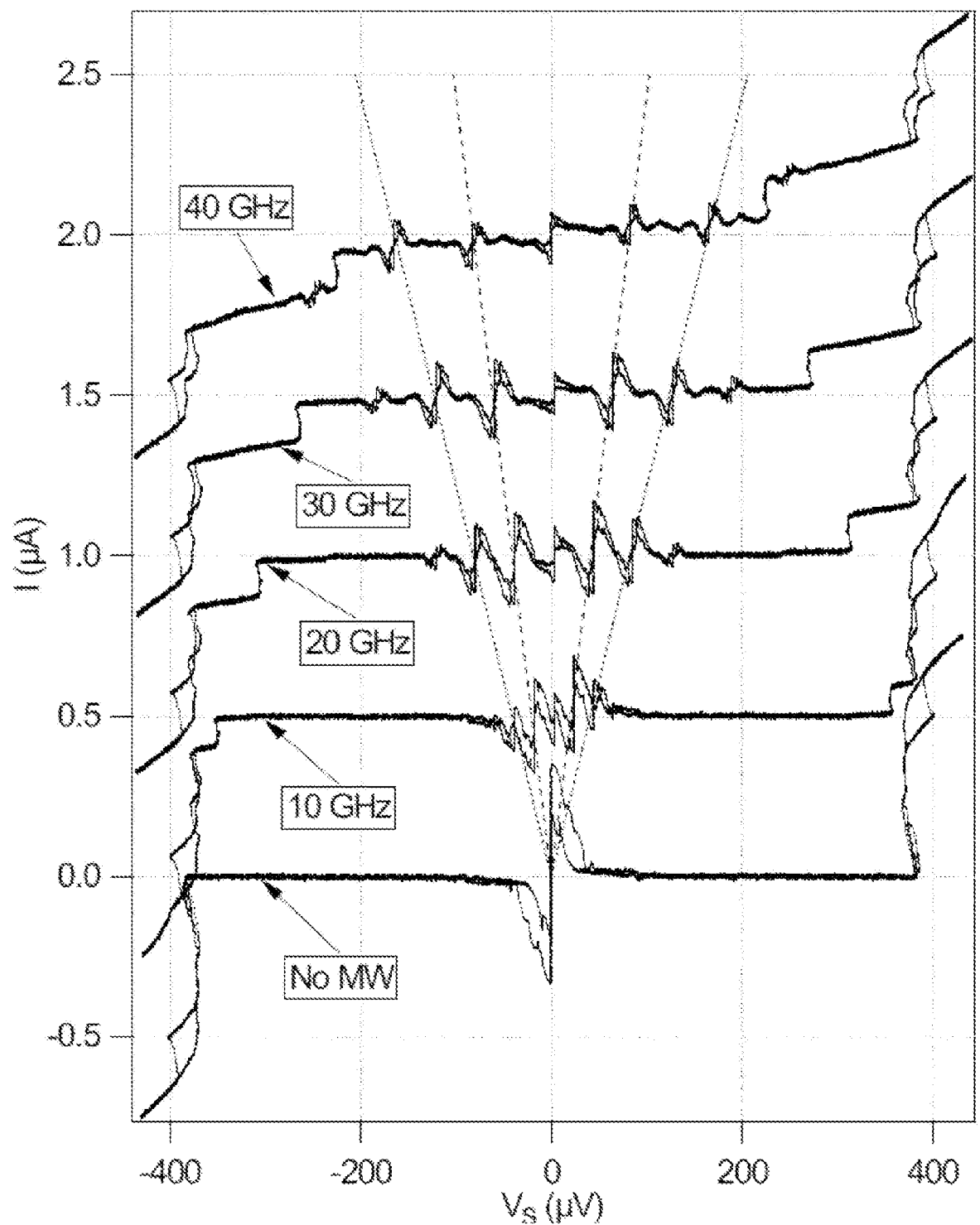
FIG. 12 illustrates current-voltage characteristics of a junction module of the voltage source of FIG. 1 for different frequency values of control signal.

FIG. 12 illustrates the current-voltage characteristics of the junction module 12 for five frequency values: a curve (No MW) corresponds to the absence of control signal and four other curves correspond to frequency values of 10 GHZ, 20 GHz, 30 GHz and 40 GHz, the amplitude of this signal being adjusted at each frequency to maximize the Shapiro current of order 1. Each curve superposes two current-voltage characteristics: one measured at increasing voltage Vs, the other at decreasing voltage Vs. They are different due to the hysteretic nature of the Josephson junctions.

In FIG. 12, four discontinuous lines represent the current-voltage values for which a Shapiro current of order 1 appears. Only seven characteristics are shown in FIG. 12 for purpose of simplification; however, measurements made for all the possible frequencies of the control signal make it possible to deduce that at least for any frequency higher than or equal to 8 GHz, it is possible to maintain a non-zero Shapiro current, making the above-described locking step possible.

Figure 13:
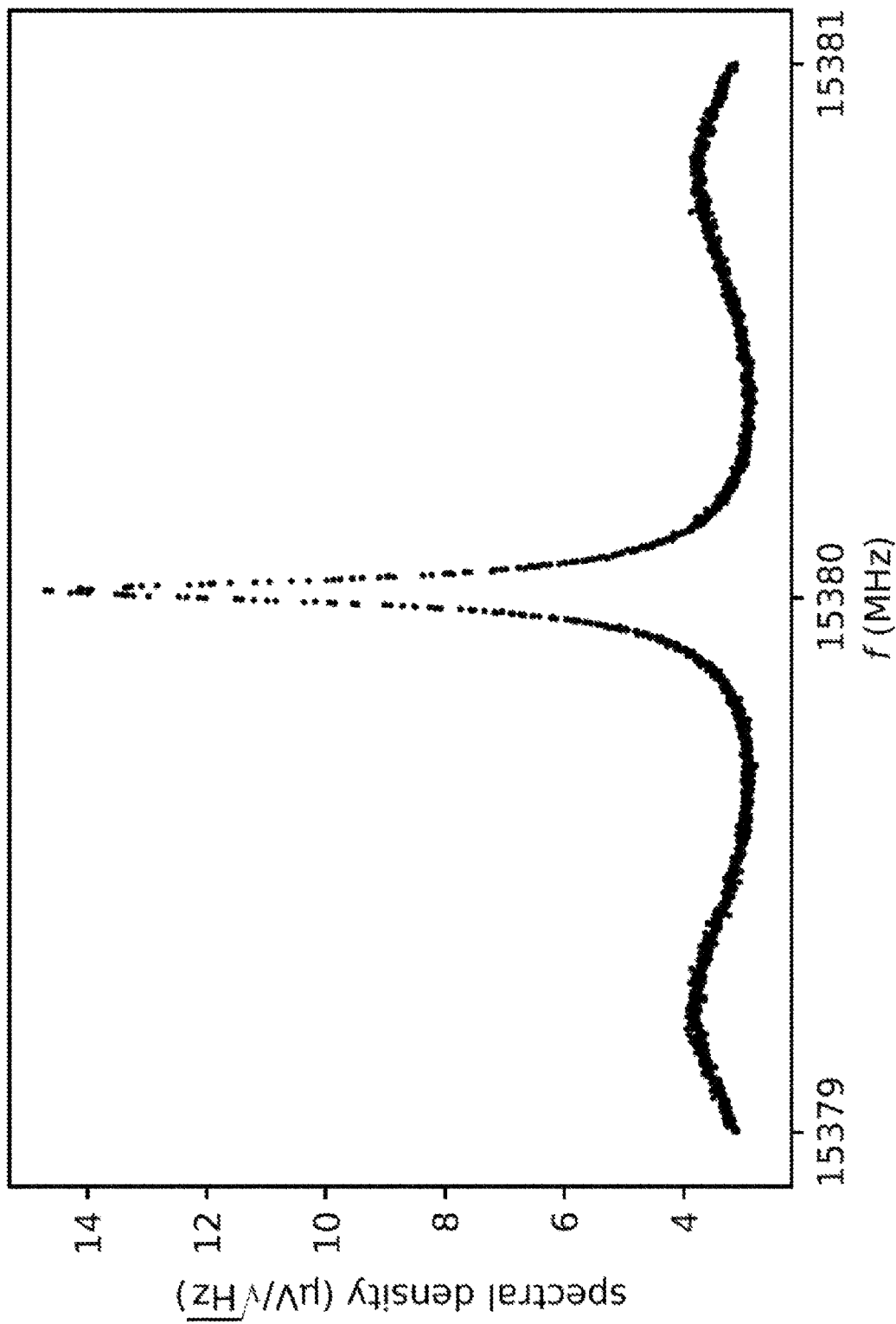
FIG. 13 illustrates the result of an indirect measurement of the accuracy of the voltage source of FIG. 1.

FIG. 13 illustrates the result of a measurement of the accuracy of the voltage source 1.

In order to make this measurement, a measurement device is coupled between the first output terminal 10 and the second output terminal 11, instead of the electrical device DUT. The measurement device is here configured to receive a DC voltage and to output an AC voltage, whose spectral density is representative of the accuracy of the voltage source 1. For example here, the measurement device includes a Josephson junction coupled between the first output terminal 10 and the second output terminal 11 and the junction of the measurement device outputs an AC signal of frequency f=Vs*2*e/h due to the AC Josephson effect. Thus, the measurement module operates similarly to the voltage source, except that its input signal is a DC voltage and that it outputs an AC voltage.

A transmission peak is observed at about 15380 MHz, which corresponds to a voltage Vs of 31.8 μV. The width of this transmission peak is proportional to the DC voltage noise provided by the voltage source 1. It may be deduced from the half-height width of the transmission peak, here 60 kHz, that the relative accuracy of the voltage source is at least $4*10^{-6}$, that is to say that the voltage source provides a noise of 125 picovolts for a signal of 31.8 microvolts.

Figure 14:
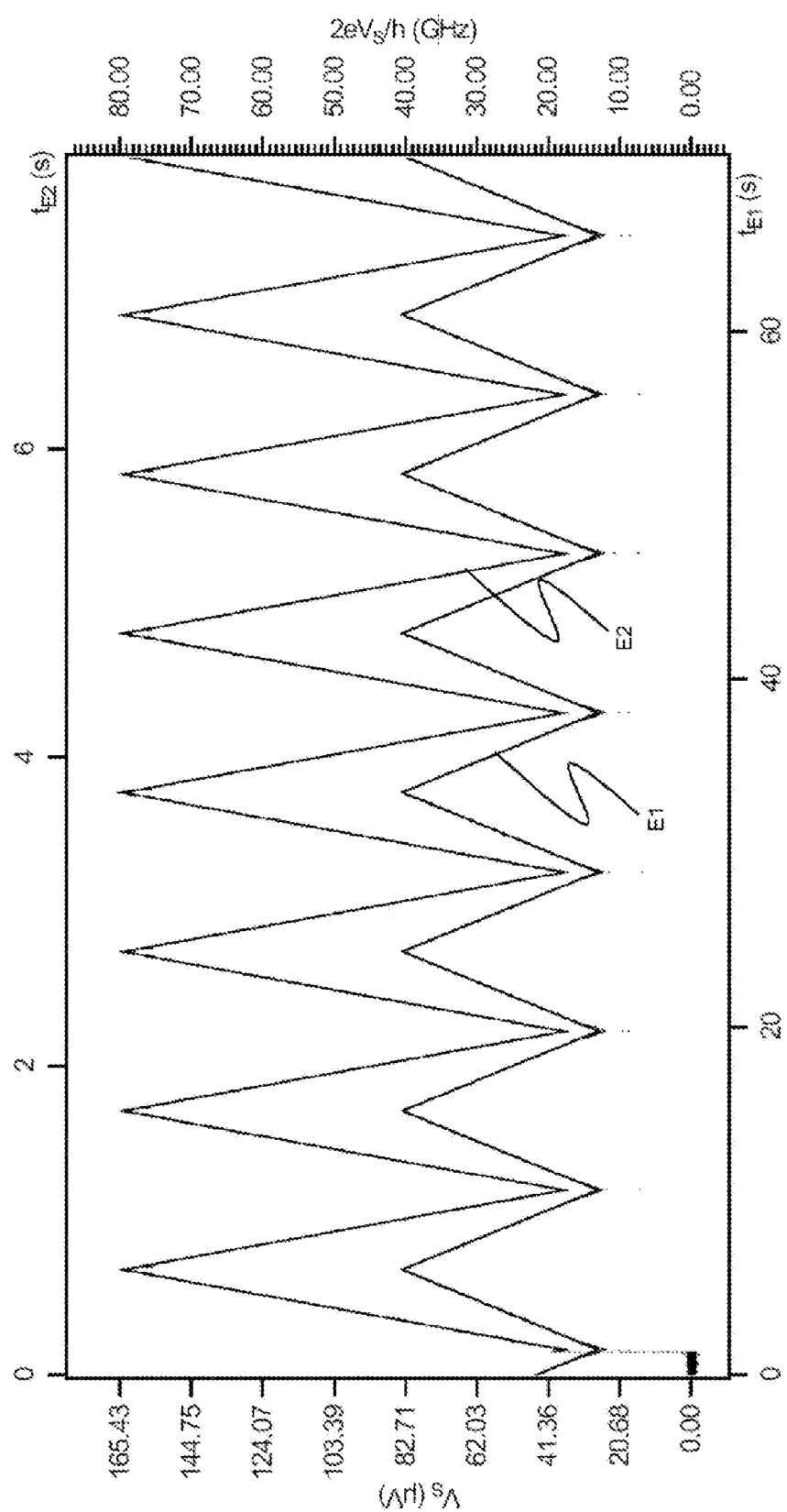
FIG. 14 illustrates the results of measurements of the voltage provided by the voltage source of FIG. 1.

FIG. 14 shows two measurements of the output voltage of the voltage source 1 as a function of time when the frequency of the control signal is varied.

In FIG. 14, a first curve E1 relates to a measurement made for a time of about 70 seconds when the voltage source operates according to the above-described embodiment, that is to say when the Shapiro current of order 1 of the junction module is maximum, when the frequency of the control signal varies from 12 GHz to 40 GHz. The time of 70 seconds corresponds to the data acquisition time and does not indicate a time limit for locking the voltage source.

It is observed that the output voltage Vs varies from about 25 microvolts to about 83 microvolts; according to the metrological proportionality coefficient h/2e. The curve E2 will be described in detail hereinafter.

The mode of implementation of the calibration method described here is in no way limiting and it is possible to apply the calibration method to a Shapiro current of higher order. In particular, the use of a Shapiro current of order n makes it possible to divide by n the frequency of the control signal required to obtain a same voltage Vs.

According to an exemplary embodiment, the calibration method according to the invention includes, for each frequency of the control signal 6 in the predetermined frequency band, determining the optimum amplitude of the control signal 6 for which the Shapiro current of order 2 of the junction module 12 is maximum.

The method according to this embodiment proceeds similarly to what has been described hereinabove in connection with FIG. 10. However, at step E6, a second optimum value, which corresponds to the amplitude of the control signal that maximizes the Shapiro current of order 2, or as an alternative for which the Shapiro current of order 2 is higher than a second predetermined threshold, is determined.

The second optimum value is equal to the first cancelling amplitude at which a second predetermined coefficient has been applied, which is determined similarly to the first predetermined coefficient, except that it corresponds to the ratio between the second optimum amplitude and the first cancelling amplitude. A value indicative of this coefficient is 1.2700.

The second optimum amplitude values are recorded in the lookup table in such a way as to be each associated with their respective current frequency.

Once the calibration procedure completed, the voltage source 1 can be used similarly to what has been described hereinabove in connection with the operation on a Shapiro current of order 1, except that:

In operation, during the locking step, after disconnection of the polarization circuit 47 from the voltage source 1, the desired output voltage value Vss is indicated via the adjustment module 5, and the adjustment module 5 determines the frequency f corresponding to the desired output voltage Vss, in such a way that Vss=2*hf/2e.

The control signal 6 having the frequency f and the cancelling amplitude is applied to the junction module 12, in order to minimize the toggle threshold of the supercurrent. Similarly to what has been described hereinabove in connection with the Shapiro current of order 1, the output voltage Vs toggles towards the voltage value Vs=1*hf/2e.

An additional step includes minimizing the Shapiro current of order 1 by applying a second cancelling amplitude, that is to say the non-zero minimum amplitude of the control signal 6 that cancels the Shapiro current of order 1. At this amplitude, the Shapiro current of order 2 is non-zero and the current fluctuations cause the toggling of the junction towards a stable state at the desired voltage value.

The second cancelling amplitude is equal to the first cancelling amplitude at which a third predetermined coefficient has been applied. The third coefficient is determined similarly to the first predetermined coefficient, except that it corresponds to the ratio between the second cancelling amplitude and the first cancelling amplitude. A value indicative of this coefficient is 1.5933.

In a last step, the Shapiro current of order 2 is maximized by adjusting the amplitude of the control signal 6 to the second optimum value.

From then on, the voltage source is locked on the Shapiro current of order 2. When another desired voltage value is indicated, the adjustment module 5 selects a frequency/second optimum amplitude couple in the lookup table and applies the control signal having these values.

The curve E2 of FIG. 14 relates to a measurement of the output voltage Vs made for about 8 seconds when the voltage source 1 operates according to this latter embodiment, that is to say when the Shapiro current of order 2 of the junction module is maximum, by varying the frequency of the control signal from 9 GHz to 39.5 GHz. It is observed that the output voltage Vs varies from about 37 microvolts to about 163 microvolts, according to a second metrological proportionality coefficient equal to 2*h/2e*f. The time of 8 seconds corresponds to the data acquisition time and does not indicate a time limit for locking the voltage source. The portion of the curve E2 close to a zero voltage comes from the fact that the data acquisition has started a fraction of second before the locking.

The lookup tables described hereinabove include the frequency/optimum amplitude couples, the optimum amplitudes of each couple being obtained by application of a predetermined coefficient to the first cancelling values. As an alternative, it would be possible that the lookup tables include the frequency/first cancelling amplitude couples, and that the adjustment means are configured to automatically apply the suitable predetermined coefficient during the operation of the voltage source.

According to an embodiment, it is possible to set the source in such a way that it provides sequentially different output voltage values, each output voltage value being obtained by the above-described method.

Figure 15:
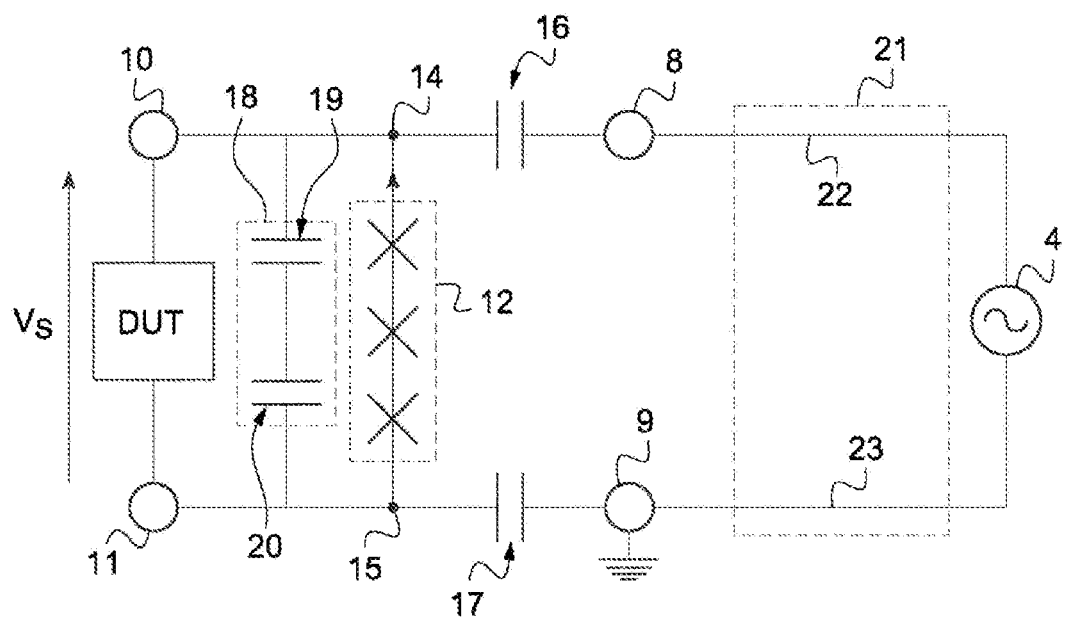
FIG. 15 illustrates an alternative embodiment of the integrated circuit of FIG. 2.
Figure 16:
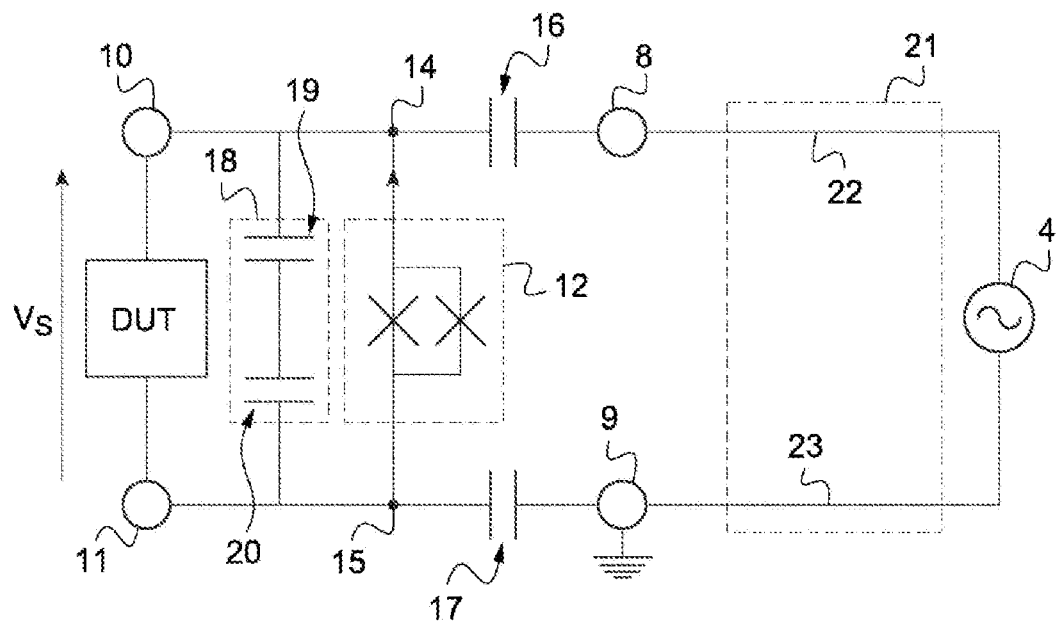
FIG. 16 illustrates another alternative embodiment of the integrated circuit of FIG. 2.

In the above-described voltage source 1, the junction module 12 includes a single Josephson junction 13. As an alternative, it would be perfectly possible that the junction module 12 includes a plurality of Josephson junctions. For example, as illustrated in FIG. 15, the junction module could comprise a plurality of Josephson junctions mounted in series or, as illustrated in FIG. 16, the junction module 12 could comprise a plurality of Josephson junctions mounted in parallel. The junction module 12 could further include both Josephson junctions mounted in series and Josephson junctions mounted in parallel.

In the case of a junction module consisted of a plurality of junctions in series and/or in parallel, the Josephson junctions are preferentially made similarly to each other in such a way that the toggling events occur simultaneously for all the junctions of the module.

Although the invention has been described in relation with a cryogenic module being a dilution cryostat, the invention is compatible with any type of cryostat insofar as the latter makes it possible to place the integrated circuit 2 in a superconducting state, that is to say subject to possible adaptation of the materials of the integrated circuit 2. The invention is for example compatible with a helium bath cryostat and with a pulsed tube cryostat that make it possible to reach temperatures close to 4K, the conductive elements of the integrated circuit being then made for example of Niobium. The procedure for making the insulating barrier separating the two electrodes 14, 15 of the junction 12 can thus comprise depositing a few nanometres of insulating material, or depositing a few nanometres of aluminium, totally or almost-totally oxidizing this layer of aluminium.

The above-described adjustment module 5 makes it possible to adjust the amplitude and frequency of the control signal by controlling the microwave generator 4. As an alternative, it is perfectly possible that the adjustment module 5 does not control the microwave generator 4 but includes attenuators and/or amplifiers configured to receive the control signal 6, to perform amplification and/or attenuation operations, and to transmit the amplified and/or attenuated control signal to the integrated circuit 2. For example, in this case, the adjustment module 5 comprises a computer that controls said attenuators and/or said amplifiers.

Finally, although the above-described calibration method includes measuring the output voltage Vs and detecting a variation of the output voltage Vs that corresponds, after application of a predetermined amplitude for which the Shapiro current of order 1 of the junction module 12 is maximum, it would be possible, in order to determine this value, to determine the current-voltage characteristic of the junction module for each possible amplitude or for a plurality of possible amplitudes of each current frequency of the control signal, and to determine for each frequency value, the established current-voltage characteristic having the highest value of Shapiro current of order 1 in order to obtain directly the optimum amplitude.

The invention claimed is:

1. An electrical voltage source comprising:
   an integrated circuit including
      a first input terminal and a second input terminal configured to receive an electrical control signal,
      a first output terminal and a second output terminal configured to provide an output voltage, and
      a junction module including at least one Josephson junction and that is coupled to the first and second input terminals and to the first and second output terminals such that the value of the output voltage depends on the frequency of the electrical control signal;
   a cryogenic module configured to maintain the integrated circuit in conditions in which the integrated circuit is in a superconducting state;
   a microwave generator coupled to the first and second input terminals and configured to produce the electrical control signal; and
   an adjustment module configured to adjust the amplitude of the electrical control signal as a function of its frequency according to a predetermined rule,
   wherein the predetermined rule includes the association of at least certain frequency values of the control signal with a respective optimum amplitude value using a lookup table, the adjustment module being configured to make the voltage source pass from a first configuration, in which the control signal has a first frequency value and a first optimum amplitude value corresponding to the lookup table, to a second configuration in which the control signal has a second frequency and a second optimum amplitude value corresponding to the lookup table.

2. The voltage source according to claim 1, wherein the predetermined rule includes the association of at least certain frequency values of the control signal with a respective optimum amplitude value.

3. The voltage source according to claim 1, wherein the adjustment module is configured to adjust the frequency of the electrical control signal in a predetermined frequency band.

4. The voltage source according to claim 3, wherein the predetermined frequency band has a width of at least 5 GHZ.

5. The voltage source according to claim 1, wherein the adjustment module is configured to adjust the frequency of the electrical control signal with an adjustment pitch lower than or equal to 100 KHz.

6. The voltage source according to claim 1, wherein the junction module is coupled to the first and second input terminals via a wide-band coupling circuit.

7. The voltage source according to claim 6, wherein the adjustment module is configured to adjust the frequency of the electrical control signal in a predetermined frequency band and the wide-band coupling circuit includes an electric path that couples the junction module to the first and second input terminals and whose length is lower than the wavelength of the control signal in the integrated circuit, at the maximum frequency of said predetermined frequency band.

8. The voltage source according to claim 1, wherein the first input terminal and the second input terminal are coupled to the microwave generator via a microwave transmission line.

9. The voltage source according to claim 1, wherein the junction module includes a first junction electrode coupled to the first output terminal and coupled to the first input terminal via a first decoupling capacitor, and a second junction electrode coupled to the second output terminal and coupled to the second input terminal via a second decoupling capacitor.

10. The voltage source according to claim 1, wherein the junction module includes a plurality of Josephson junctions.

11. The voltage source according to claim 10, wherein at least two junctions of the plurality of junctions are mounted in parallel.

12. The voltage source according to claim 10, wherein at least two junctions of the plurality of junctions are mounted in series.

13. The voltage source according to claim 1, wherein the adjustment module is configured to interpolate an intermediate amplitude value as a function of at least two amplitude values associated with consecutive frequency values in the lookup table.

14. A method for calibrating the voltage source according to claim 1, the method comprising:
for each frequency of a set of frequencies of the control signal, determining an optimum amplitude of the control signal for which a Shapiro current of the junction module is non-zero, and establishing a predetermined rule for associating each frequency with a corresponding optimum amplitude,
wherein the predetermined rule includes the association of the certain frequency values of the control signal with the respective optimum amplitude value using the lookup table.

15. The calibration method according to claim 14, wherein the Shapiro current is a Shapiro current of order 1.

16. The method according to claim 15, wherein the determining the optimum amplitude includes
polarizing the junction module such that the output voltage is zero and that a non-zero current passes through the junction module,
measuring the output voltage, the measurement being characterized by a measurement uncertainty,
determining a minimum amplitude value of the control signal at which the output voltage varies with a predetermined amplitude, and
applying a predetermined coefficient to said minimum amplitude value in order to obtain said optimum amplitude.

17. The method according to claim 16, wherein the predetermined amplitude is at least equal to four times the measurement uncertainty.

18. The method according to claim 14, wherein said frequencies of the set of frequencies are spaced apart by a maximum of 100 MHZ.

* * * * *